(12) United States Patent
Griffin

(10) Patent No.: US 7,297,008 B2
(45) Date of Patent: Nov. 20, 2007

(54) CAM AND LEVER EJECTOR ASSEMBLY

(75) Inventor: Joseph Dewey Griffin, Lake Oswego, OR (US)

(73) Assignee: Alcatel USA Sourcing, L.P., Plano, TX (US)

( * ) Notice: Subject to any disclaimer, the term of this patent is extended or adjusted under 35 U.S.C. 154(b) by 128 days.

(21) Appl. No.: 10/856,709

(22) Filed: May 28, 2004

(65) Prior Publication Data

US 2004/0242039 A1    Dec. 2, 2004

Related U.S. Application Data

(60) Provisional application No. 60/475,218, filed on May 30, 2003.

(51) Int. Cl.
*H01R 13/62* (2006.01)
(52) U.S. Cl. ...................................................... 439/157
(58) Field of Classification Search ............... 439/157, 439/347, 372
See application file for complete search history.

(56) References Cited

U.S. PATENT DOCUMENTS

| 4,975,073 | A | 12/1990 | Weisman |
| 7,114,984 | B2 * | 10/2006 | Shirk et al. ................. 439/157 |
| 7,121,866 | B2 * | 10/2006 | Testa et al. ................. 439/347 |
| 2002/0182909 | A1 | 12/2002 | Stathopoulos et al. |

* cited by examiner

*Primary Examiner*—Khiem Nguyen
(74) *Attorney, Agent, or Firm*—Van Pelt, Yi & James LLP

(57) ABSTRACT

An ejector assembly for securing a modular assembly in a chassis is disclosed. The ejector assembly comprises a cam rotatably mounted to the modular assembly such that the cam may be rotated about a first axis, the cam having a control member configured to extend into a recess in the chassis when the cam is rotated into a locked position and be retracted from the recess when the cam is rotated into a retracted position; and a lever rotatably mounted to the modular assembly such that the lever may be rotated about a second axis substantially parallel to the first axis, the lever being configured to cause the cam to be rotated about the first axis when a force is applied to the lever to rotate the lever about the second axis, whereby the cam may be rotated into either the locked position or the retracted position by operating the lever.

9 Claims, 8 Drawing Sheets

CAM AND LEVER EJECTOR ASSEMBLY

CROSS REFERENCE TO RELATED APPLICATIONS

This application claims priority to U.S. Provisional Patent Application No. 60/475,218 entitled Cam and Lever Ejector Assembly filed May 30, 2003, which is incorporated herein by reference for all purposes.

FIELD OF THE INVENTION

The present invention relates generally to modular assemblies. More specifically, a cam and lever ejector assembly is disclosed.

BACKGROUND OF THE INVENTION

Modular systems are used in many applications to provide flexibility and facilitate repair, maintenance, and upgrades. In the telecommunications industry, it is common to provide a system chassis or back plane into which one or more modular components, such as printed circuit boards, may be inserted.

To facilitate the insertion and removal of such modular components, and to enable such components to be locked into place once installed, a variety of locking and ejection devices have been provided. In one approach, an "ejector" lever is provided. In a locked position, a cam portion of the lever arm extends into a detent in the chassis, locking the modular component securely into place. In an unlocked position, the cam portion does not extend into the detent, thereby making it possible to slide the modular component into or out of a position in the chassis.

FIG. 1A shows a frontal view of a chassis 100 configured to receive a modular component (not shown). The chassis 100 comprises a frame 102, the front of which is shown in FIG. 1A. The frame 102 is formed in such a way as to leave an opening 104 into which a modular component may be inserted. FIG. 1B shows a top sectional view of the chassis 100 in the plane indicated by the arrows "A" in FIG. 1A. FIG. 1B shows the frame 102 comprising a left detent 106 and a right detent 108, such as may be provided to receive the cam portion of the ejector lever described above.

FIG. 2A shows a typical prior art modular device 200. The modular device 200 comprises a modular component 202 having a face plate 230, a left ejector lever 204 attached to a left lever support 206 in a manner that permits the lever 204 to be rotated as indicated by the arrow 208 about an attachment point 210. The modular device 200 further comprises a right ejector lever 212 attached to a right lever support 214 in a manner that permits the lever 212 to be rotated as indicated by the arrow 216 about an attachment point 218. In the position shown in FIG. 2A, the ejector levers 204 and 212 are in an unlocked position and would not impede the insertion or extraction of the modular device 200 from a chassis, such as the chassis 100 of FIGS. 1A and 1B. FIG. 2B shows the levers 204 and 212 after they have been rotated into a locked position. In this locked position, the lever 204 can be seen to comprise a cam portion 220 and the lever 212 to comprise a cam portion 222. In one typical configuration, the cam portion 220 and cam portion 222 would in the position shown in FIG. 2B extend into a detent in the chassis frame, such as the detents 106 and 108 of FIG. 1B. The arrows in FIG. 2B show the direction in which the lever arms 204 and 212 would be rotated to return them to the unlocked position shown in FIG. 2A.

A problem that may arise with the above-described approach to locking a modular component into a chassis or other frame is that the non-cam portion of the ejector lever arm may block access to a portion of the face plate of the modular component when the component has been installed and the lever arm(s) is(are) in the locked position. In FIG. 2B, for example, in the locked position shown the lever arms 204 and 222 block viewing of and access to portions of the face plate 230 of the modular component 202. As such, in the locked position the lever arms may interfere with the viewing of indicator lights or other displays, and may interfere with the removal or insertion of cables or modular subcomponents that the modular component 202 may be configured to receive, such as the swapping of media daughter access (MDA) modules in a network switch input/output (I/O) module installed in a network switch chassis.

Therefore, there is a need for a way to provide for the locking and ejection of modular components from a chassis that does not result in a lever arm or other structure being in a position that would block viewing of and/or access to the face plate of the modular component.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A cam and lever ejector assembly is disclosed. In one embodiment, the lever portion of the ejector assembly has been decoupled from the cam portion of the assembly. In one embodiment, a gear mechanism is used to transmit force from the lever to the cam, in such a way that the lever portion does not block access to the front of the modular component when the ejector assembly is in the installed and locked position.

Figure 3A:
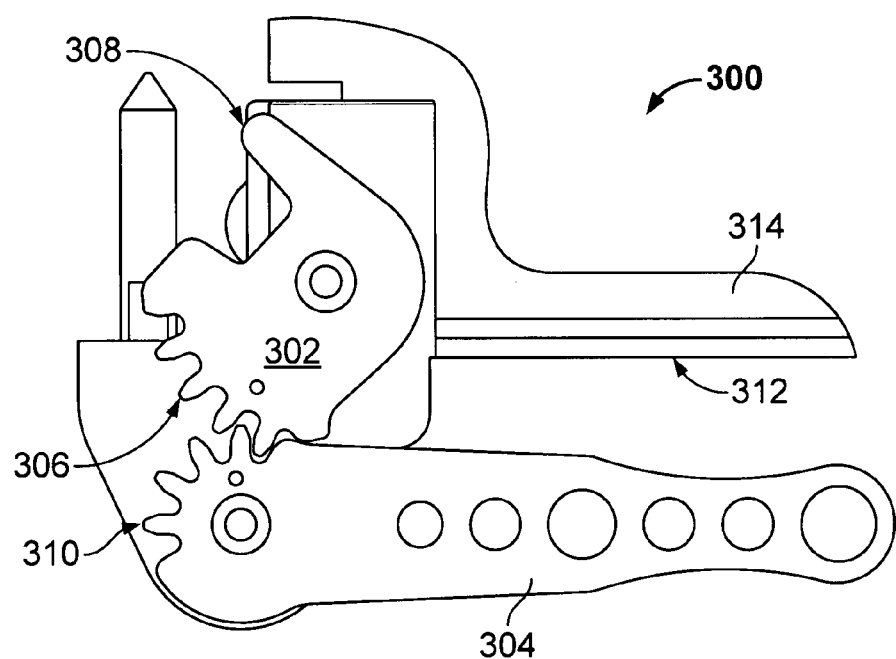
FIG. 3A shows a cam and lever ejector assembly comprising a cam 302 and a lever 304.

FIG. 3A shows a cam and lever ejector assembly comprising a cam 302 and a lever 304. The cam 302 comprises a toothed portion 306 that includes a plurality of gear teeth and a control member 308. The lever 304 comprises a toothed portion 310 configured and positioned to engage the toothed portion 306 of the cam 302 as shown. In the position shown, the cam and lever ejector assembly is in the unlocked position, in which the control member 308 of the cam 302 is retracted, thereby ensuring that the cam 302 does not interfere with the insertion or extraction of the component 314 from a chassis or other frame. In this unlocked position, the lever 304 is in a position that may block access to a portion of the faceplate 312 of the component 314, but that condition typically would be acceptable for periods during which the component 314 is being inserted into or extracted from a chassis.

Figure 3B:
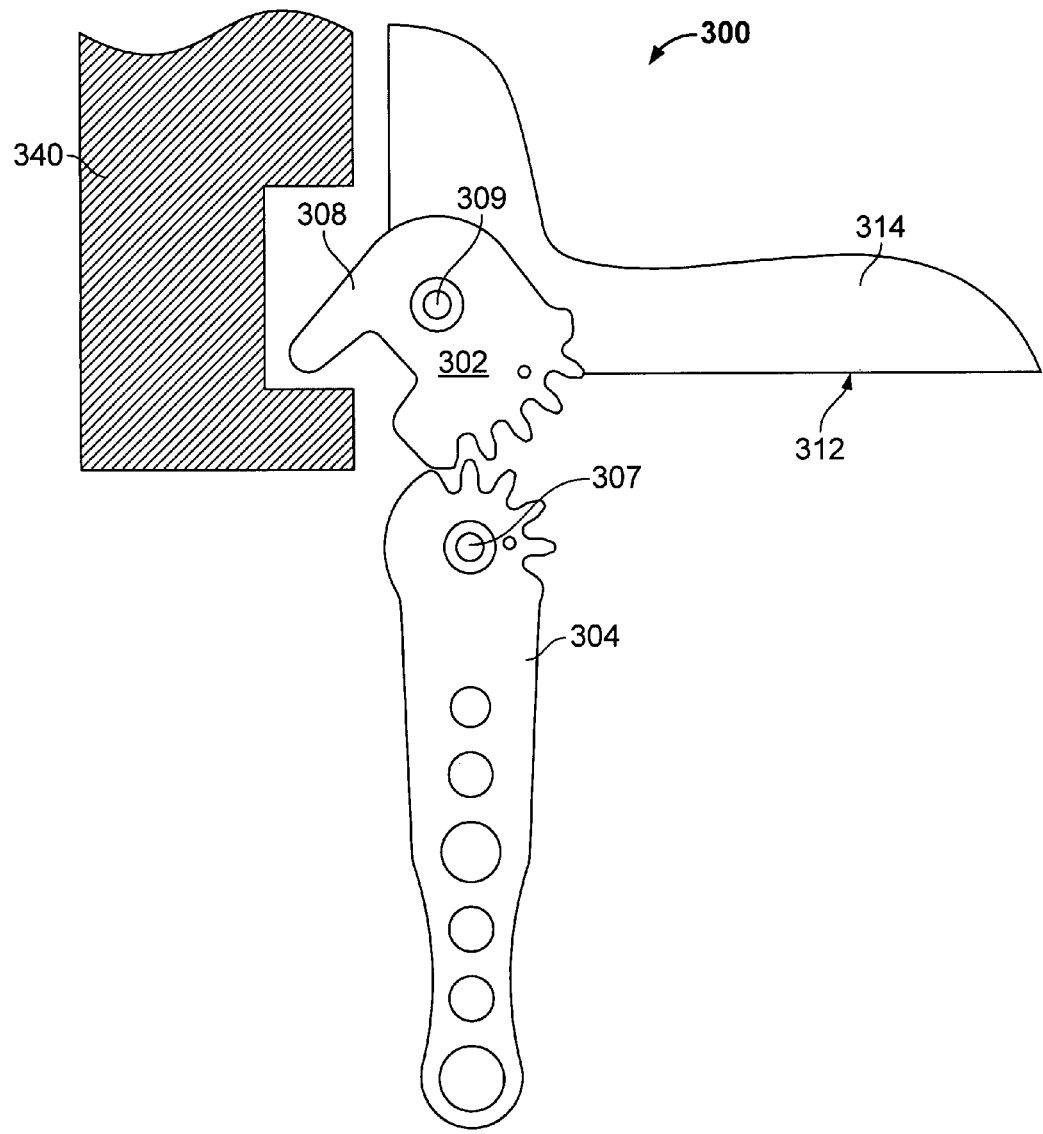
FIG. 3B shows the cam and lever ejector assembly 300 in the locked position.

FIG. 3B shows the cam and lever ejector assembly 300 in the locked position. The lever 304 has been rotated about its pivot point 307, to the position shown, which has resulted in the cam 302 being rotated into a locked position by interaction of the toothed portion 310 of lever 304 with the toothed portion 306 of cam 302. The pivot point 307 is fixed in relation to the component 314 and the lever 304 is rotatably mounted to the component 314 (or some structure, such as a tab or extension, affixed to the component 314) at that point. Rotation of lever 304 into the position shown has caused the cam 302 to be rotated about its pivot point 309 into the position shown. Like pivot point 307, pivot point 309 is fixed in relation to the component 314 and is the point at which the cam 302 is rotatably mounted to the component 314 (or some structure, such as a tab or extension, affixed to the component 314). In this locked position, the control member 308 of the cam 302 extends into a detent in the chassis 340, thereby preventing the modular component 314 from being extracted. In the locked position shown, the lever 304 is in a position that does not block access to the faceplate 312 of the modular component 314 (compare FIG. 3A), which would permit the viewing of indicators and displays and the swapping of cables or modular subcomponents, as applicable, during times when the modular component 314 is in the installed and locked position. In one embodiment, the respective toothed portions of the cam 302 and the lever 304 are configured to provide a mechanical advantage, thereby enabling the lever 304 to be shorter than otherwise would be necessary, with the result that the lever 304 does not extend too far out from the faceplate of the modular component when the modular component is in the installed and locked position, as shown in FIG. 3B.

While in certain of the embodiments shown and described in detail herein a gear mechanism is used to cause the cam to rotate in response to movement of the lever, other mechanisms for transmitting force generated by rotating the lever 304 about its pivot to cause the cam 302 to rotate about its pivot into the locked or retracted position, as applicable, may be used.

Figure 4A:
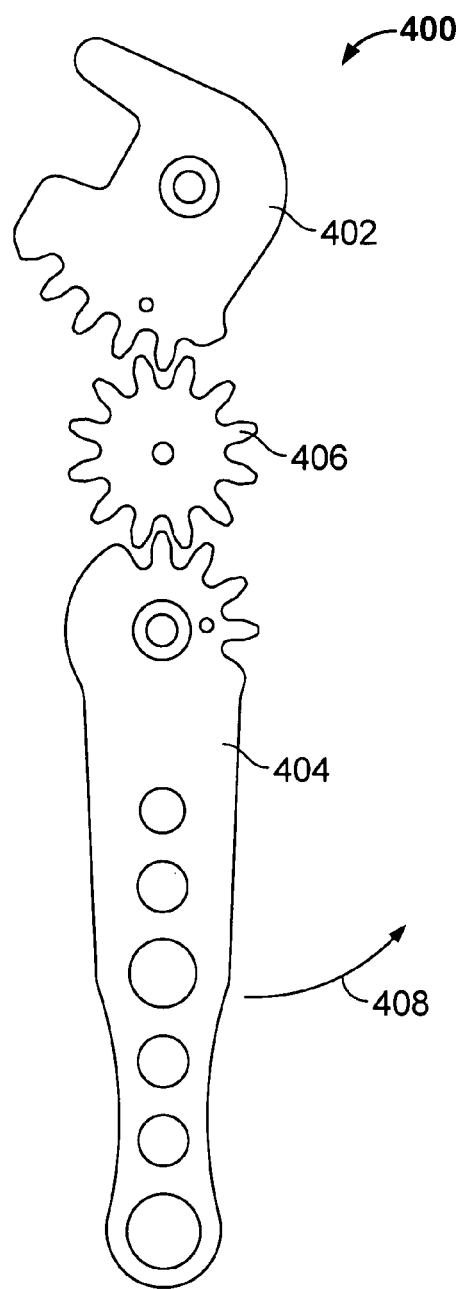
FIG. 4A shows a cam and lever ejector assembly 400 comprising a cam 402, a lever 404, and an idler gear 406 interposed between the two.
Figure 4B:
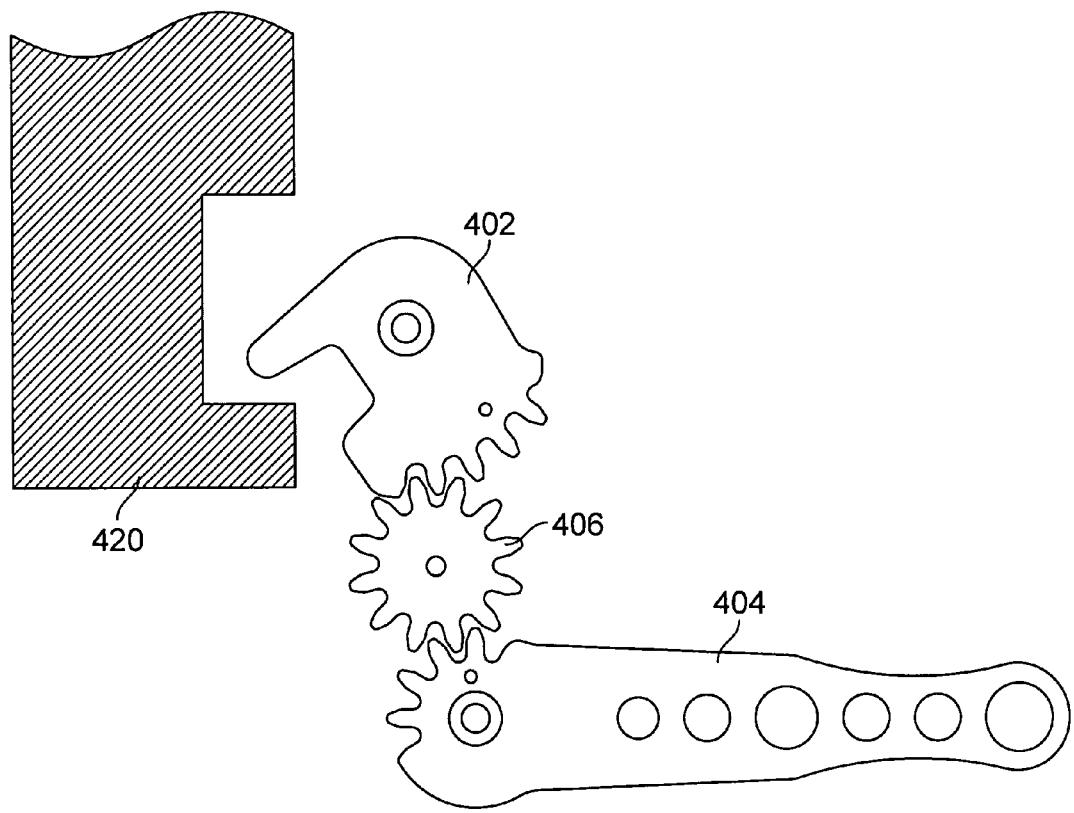
FIG. 4B shows the lock portion of the cam 402 extending into the corresponding detent in the chassis 420.

FIGS. 4A and 4B show a variation on the cam and lever ejector assembly shown in FIGS. 3A and 3B in order to reverse the position of the lever in the locked and unlocked positions. FIG. 4A shows a cam and lever ejector assembly 400 comprising a cam 402, a lever 404, and an idler gear 406 interposed between the two. The toothed portion of the lever 404 engages the idler gear 406 at one point, and the toothed portion of the cam 402 engages the idler gear 406 at a second point, such that rotation of the lever 404 in the direction of arrow 408 causes the idler gear 406 to rotate in the clockwise direction, which in turn causes the cam 402 to rotate in the counterclockwise direction. In one embodiment, the position shown in FIG. 4A corresponds to the unlocked position, in which the lock portion of the cam 402 does not extend into the corresponding detent in the chassis (compare FIG. 3A). In one embodiment, moving the lever 402 in the direction of arrow 408 until the lever arm 402 is aligned with the faceplate of the modular component causes the cam 402 to be rotated into the locked position, as shown in FIG. 4B. FIG. 4B shows the lock portion of the cam 402 extending into the corresponding detent in the chassis 420. While the configuration shown in FIGS. 4A and 4B results in the lever 404 blocking at least a portion of the faceplate of the associated modular component when the component is in the installed and locked position, in one embodiment the mechanical advantage provided by the gear mechanism makes it possible to use a shorter lever 404, such that less of the face plate is blocked than would have been blocked by using a typical prior art ejector assembly, such as those shown in FIGS. 2A and 2B.

Figure 4C:
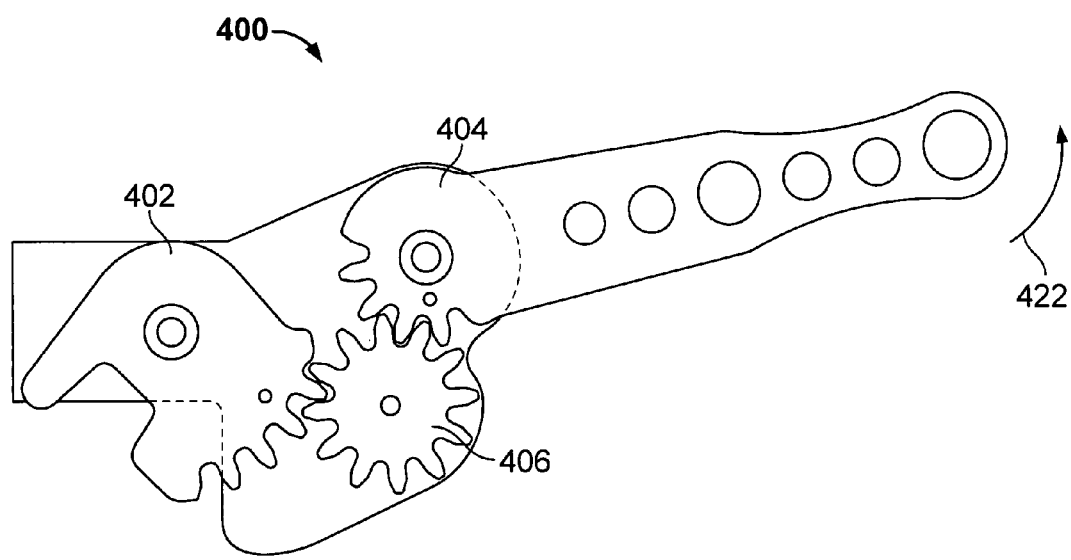
FIG. 4C shows an alternative configuration for the cam 402, lever 404, and idler gear 406, which results in a more compact configuration.

FIG. 4C shows an alternative configuration for the cam 402, lever 404, and idler gear 406, which results in a more compact configuration. The cam and lever assembly 400 is shown in FIG. 4C in the unlocked position. Rotating lever 404 in the direction of arrow 422 would cause the cam 402 to be rotated counterclockwise into the locked position, similar to that shown in FIG. 4B.

Figure 5:
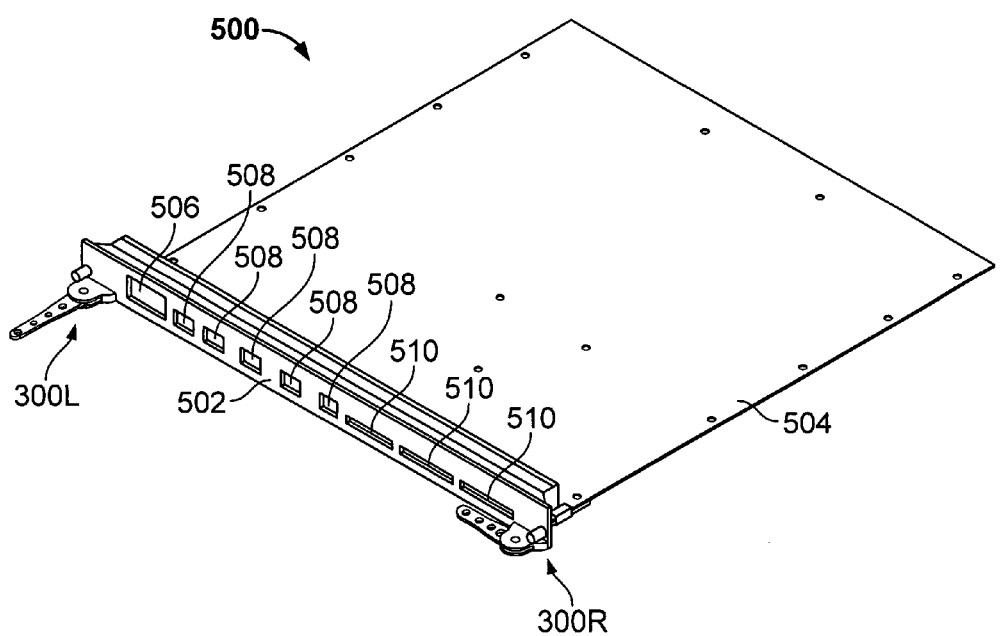
FIG. 5 shows the cam and lever ejector assembly 300 of FIGS. 3A and 3B as employed in one embodiment.

FIG. 5 shows the cam and lever ejector assembly 300 of FIGS. 3A and 3B as employed in one embodiment. A modular assembly 500 comprises a planar horizontal body portion 504 and a vertically oriented faceplate 502. The faceplate 502 includes a display 506, a variety of cable receptacles 508, and a plurality of modular subcomponents 510. The left side cam and lever ejector assembly 300 of the modular assembly 500, labeled 300L in FIG. 5 for clarity, is shown in the locked position (compare FIG. 3B), whereas the right side cam and lever ejector assembly 300 of the modular assembly 500, labeled 300R, is shown in the unlocked (cam retracted) position (compare FIG. 3A). As FIG. 5 shows, in the locked position left side ejector assembly 300L does not obscure the faceplate 502 of modular assembly 500 and, as a result, does not obscure the display 506. By contrast, if the right side cam and lever ejector assembly 300R were in the locked position in the position as shown in FIG. 5, instead of the unlocked position, the lever would obscure the rightmost modular subassembly 510, possibly preventing, e.g., that modular subassembly from being inserted, extracted, or otherwise serviced or accessed (e.g., by connecting or disconnecting a cable, reading an indicator, etc.) while the modular assembly 500 is locked in place.

Figure 1A:
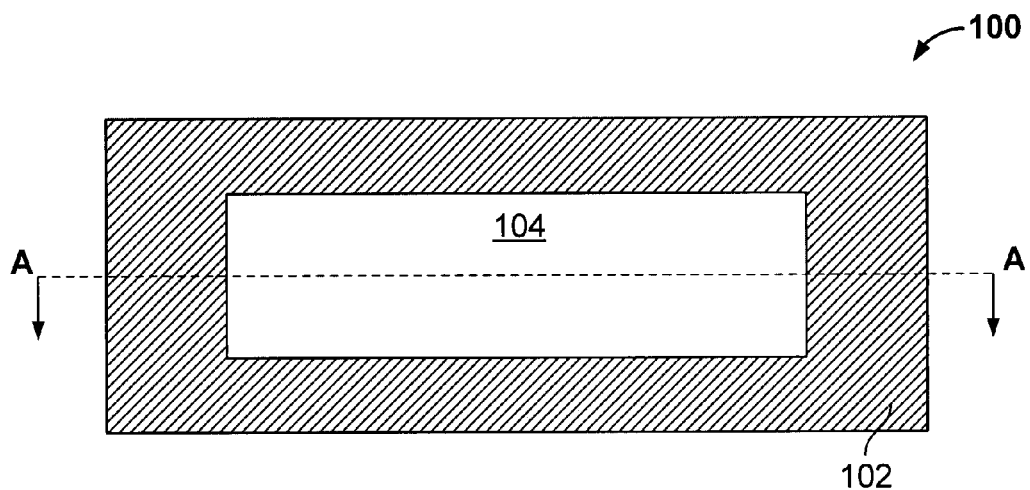
FIG. 1A shows a frontal view of a chassis 100 configured to receive a modular component (not shown).
Figure 1B:
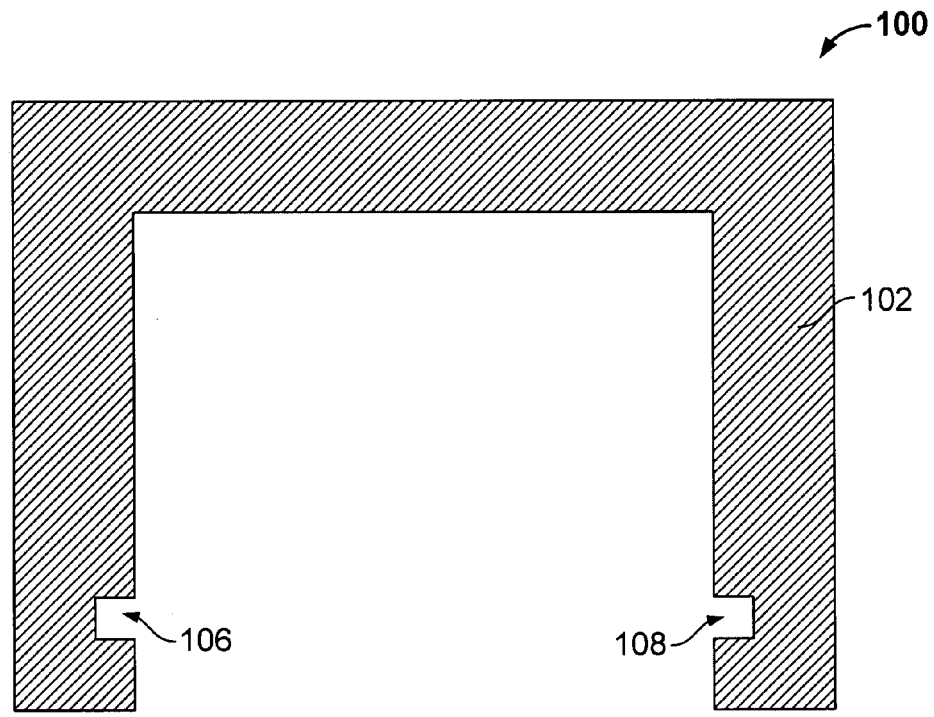
FIG. 1B shows a top sectional view of the chassis 100 in the plane indicated by the arrows "A" in FIG. 1A.
Figure 2A:
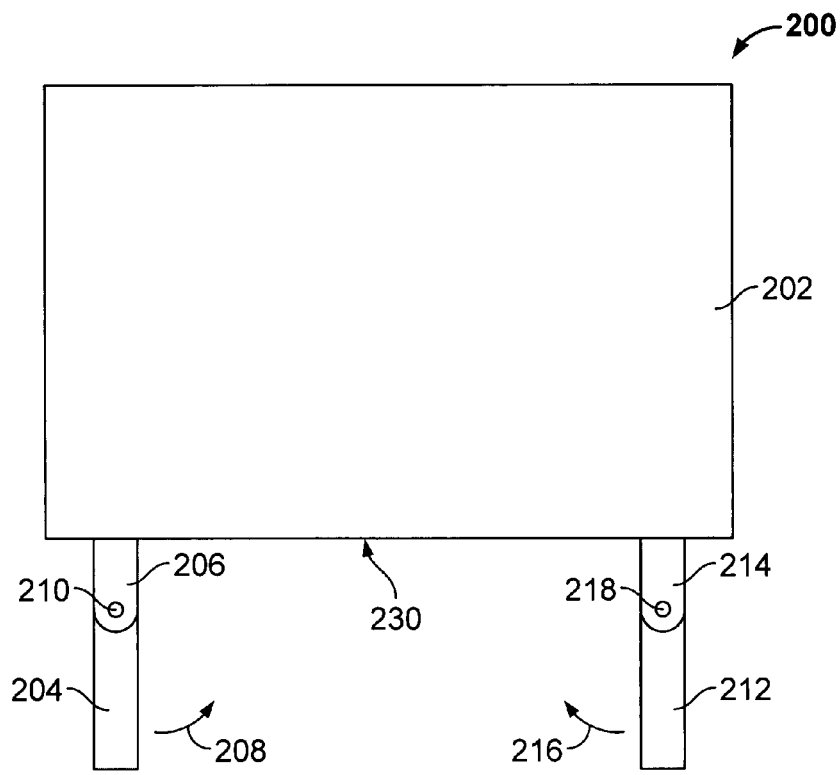
FIG. 2A shows a typical prior art modular device 200.
Figure 2B:
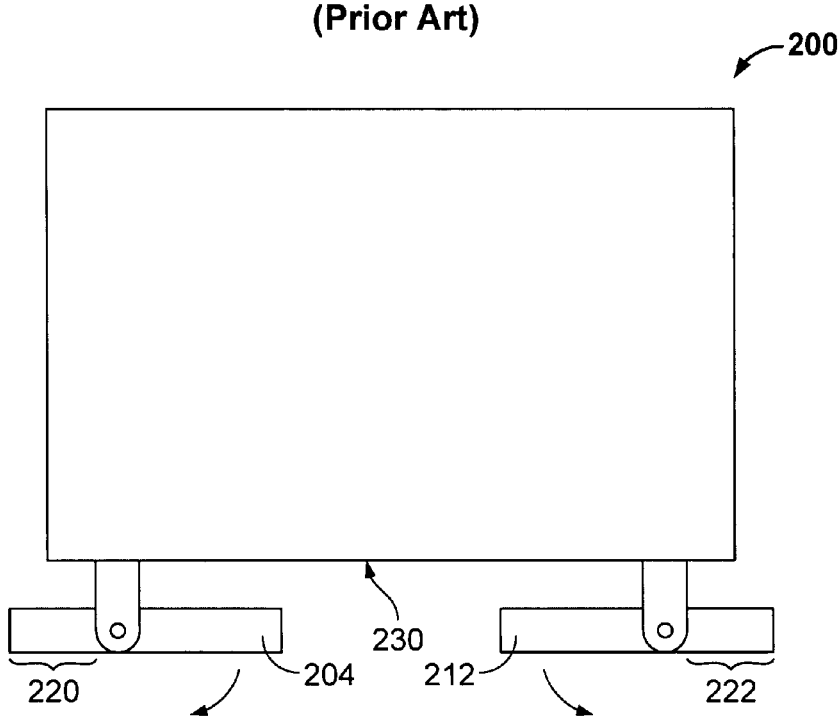
FIG. 2B shows the levers 204 and 212 after they have been rotated into a locked position.

In one embodiment, use of a cam and lever ejector assembly such as described herein has the further advantage of reducing the risk of harm to the modular component or adjacent structures or individuals due to potentially harmful emissions by reducing the size of the cut out needed in the faceplate of the modular component to accommodate the ejector assembly. In addition, in one embodiment use of a cam and lever ejector assembly such as described herein avoids the need to extend the chassis forward beyond the faceplate of the modular component to allow the cam portion of the assembly to extend into the detent in the chassis without having a large cut out in the faceplate, such as shown in FIGS. 2A and 2B.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An ejector assembly for securing a modular assembly in a chassis, comprising:
   a cam rotatably mounted to the modular assembly such that the cam may be rotated about a first axis, the cam having a control member configured to extend into a recess in the chassis when the cam is rotated into a locked position and be retracted from the recess when the cam is rotated into a retracted position; and
   a lever rotatably mounted to the modular assembly such that the lever may be rotated about a second axis substantially parallel to the first axis, the lever being configured to cause the cam to be rotated about the first axis when a force is applied to the lever to rotate the lever about the second axis, whereby the cam may be rotated into either the locked position or the retracted position by operating the lever.

2. The ejector assembly of claim 1 wherein the modular assembly comprises a front face and the cam and lever are configured such that the lever is in a first position substantially perpendicular to the front face when the cam is in the locked position and the lever is in a second position substantially parallel and adjacent to the front face when the cam is in the retracted position.

3. The ejector assembly of claim 1 wherein the cam comprises a first toothed portion having a plurality of cam gear teeth, the lever comprises a second toothed portion having a plurality of lever gear teeth, and the lever and cam are mounted and configured such that the lever gear teeth engage and transmit force to the cam gear teeth when the lever is rotated about the second axis such that when a force is applied to rotate the lever about the second axis in a first rotational direction the cam is rotated about the first axis in the opposite rotational direction.

4. The ejector assembly of claim 3 wherein the first toothed portion, the second toothed portion, the cam, and the lever are sized and positioned so as to provide a mechanical advantage that reduces the minimum lever length required for the lever to be able to rotate the cam between the locked and retracted positions by rotating the lever through a desired range of rotation.

5. The ejector assembly of claim 4 wherein the desired range of rotation is approximately 90 degrees.

6. The ejector assembly of claim 1 wherein:
   the cam comprises a first toothed portion comprising a plurality of cam gear teeth;
   the lever comprises a second toothed portion comprising a plurality of lever gear teeth;
   the ejector assembly further comprises an idler gear interposed between the cam and the lever, the idler gear having a plurality of idler gear teeth; and
   the lever, idler gear, and cam are mounted and configured such that the lever gear teeth engage and transmit force to the idler gear teeth, which in turn engage and transmit force to the cam gear teeth, when the lever is rotated about the second axis such that when a force is applied to rotate the lever about the second axis the cam is rotated about the first axis in the same rotational direction.

7. The ejector assembly of claim 6 wherein the first toothed portion, the second toothed portion, the cam, the idler gear, and the lever are sized and positioned so as to provide a mechanical advantage that reduces the minimum lever length required for the lever to be able to rotate the cam between the locked and retracted positions by rotating the lever through a desired range of rotation.

8. The ejector assembly of claim 6 wherein the modular assembly comprises a front face and the cam, idler gear, and lever are configured such that the lever is in a first position substantially perpendicular to the front face when the cam is in the retracted position and the lever is in a second position substantially parallel and adjacent to the front face when the cam is in the locked position.

9. An ejector assembly for securing a modular assembly in a chassis, comprising:
   means rotatably mounted to the modular assembly for locking the modular assembly in place in the chassis when the means for locking is in a locked position and leaving the modular assembly free to be inserted or extracted from the chassis when the means for locking is in an unlocked position; and
   means rotatably mounted to the modular assembly for engaging and rotating the means for locking, whereby the means for locking may be rotated into either the locked position or the unlocked position by operating the means for engaging and rotating.

* * * * *